United States Patent
Nishi et al.

(10) Patent No.: US 9,059,347 B2
(45) Date of Patent: Jun. 16, 2015

(54) PHOTOELECTRIC CONVERSION DEVICE AND MANUFACTURING METHOD THEREOF

(75) Inventors: Kazuo Nishi, Kanagawa (JP); Takashi Hirose, Kanagawa (JP); Naoto Kusumoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 982 days.

(21) Appl. No.: 13/159,579

(22) Filed: Jun. 14, 2011

(65) Prior Publication Data

US 2011/0308588 A1    Dec. 22, 2011

(30) Foreign Application Priority Data

Jun. 18, 2010    (JP) .................................. 2010-139666

(51) Int. Cl.
*H01L 31/06*    (2012.01)
*H01L 31/0352*    (2006.01)
*H01L 31/0376*    (2006.01)
(Continued)

(52) U.S. Cl.
CPC .... *H01L 31/03762* (2013.01); *H01L 31/03682* (2013.01); *H01L 31/03685* (2013.01); *H01L 31/03921* (2013.01); *H01L 31/1816* (2013.01); *H01L 31/1872* (2013.01); *H01L 31/202* (2013.01); *Y02E 10/545* (2013.01);
(Continued)

(58) Field of Classification Search
CPC .................. H01I 31/03682; H01I 31/03685; H01L 31/03921; H01L 31/1816; H01L 31/0465; H01L 31/202; H01L 31/1872
See application file for complete search history.

(56) References Cited

U.S. PATENT DOCUMENTS

| 4,725,558 A | 2/1988 | Yamazaki et al. |
| 4,786,607 A | 11/1988 | Yamazaki et al. |

(Continued)

FOREIGN PATENT DOCUMENTS

| EP | 0213910 A | 3/1987 |
| JP | 62-162368 A | 7/1987 |

(Continued)

OTHER PUBLICATIONS

Yamazaki, et al., "Mask-Less Fabrication of A-SI Solar Cell Using Laser Scribe Process", The conference record of the seventeenth IEEE photovoltaic specialists conference, May 1-4, 1984, pp. 206-211.

*Primary Examiner* — Seahvosh Nikmanesh
(74) *Attorney, Agent, or Firm* — Nixon Peabody LLP; Jeffrey L. Costellia

(57) ABSTRACT

A photoelectric conversion device having a high electric generating capacity at low illuminance, in which a semiconductor layer is appropriately separated and short circuit of a side surface portion of a cell is prevented. The photoelectric conversion device includes an isolation groove formed between one first electrode and the other first electrode that is adjacent to the one first electrode; a stack including a first semiconductor layer having one conductivity type over the first electrode, a second semiconductor layer formed using an intrinsic semiconductor, and a third semiconductor layer having a conductivity type opposite to the one conductivity type; and a connection electrode connecting one first electrode and a second electrode that is in contact with a third semiconductor layer included in a stack formed over the other first electrode that is adjacent to the one first electrode. A side surface portion of the second semiconductor layer is not crystallized.

10 Claims, 11 Drawing Sheets

(51) Int. Cl.
   *H01L 31/0368* (2006.01)
   *H01L 31/0392* (2006.01)
   *H01L 31/18* (2006.01)
   *H01L 31/20* (2006.01)
   *H01L 31/0465* (2014.01)

(52) U.S. Cl.
   CPC ............ *Y02E 10/546* (2013.01); *Y02E 10/548* (2013.01); *H01L 31/0465* (2014.12)

(56) References Cited

U.S. PATENT DOCUMENTS

| | | |
|---|---|---|
| 4,812,415 A | 3/1989 | Yamazaki et al. |
| 4,937,651 A | 6/1990 | Yamazaki et al. |
| 5,089,426 A | 2/1992 | Yamazaki et al. |
| 5,348,589 A | 9/1994 | Arai et al. |
| 5,453,134 A | 9/1995 | Arai et al. |
| 7,052,998 B2 | 5/2006 | Shinohara |
| 7,485,838 B2 * | 2/2009 | Nishi et al. ............... 250/214 A |
| 7,838,812 B2 * | 11/2010 | Nishi et al. ............... 250/214 R |
| 2007/0045672 A1 * | 3/2007 | Nishi et al. .................... 257/257 |
| 2009/0121119 A1 * | 5/2009 | Nishi et al. .............. 250/214 LS |

FOREIGN PATENT DOCUMENTS

| | | |
|---|---|---|
| JP | 04-336471 A | 11/1992 |
| JP | 05-183177 A | 7/1993 |
| JP | 09-266320 A | 10/1997 |
| JP | 2004-260013 | 9/2004 |
| JP | 2005-101384 A | 4/2005 |
| JP | 2010-062185 A | 3/2010 |

* cited by examiner

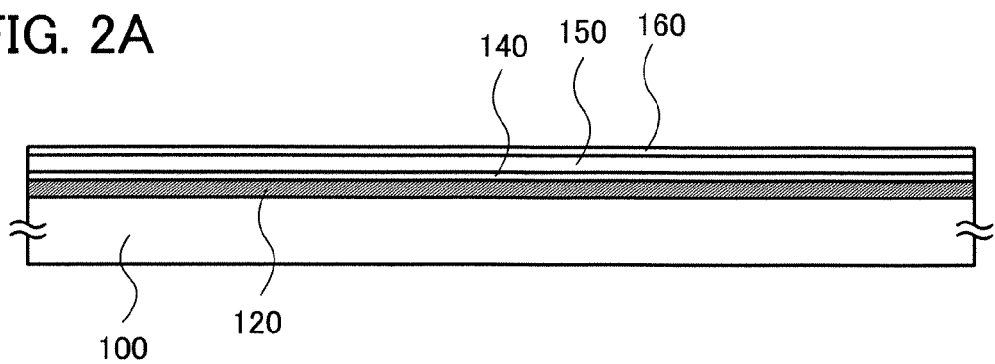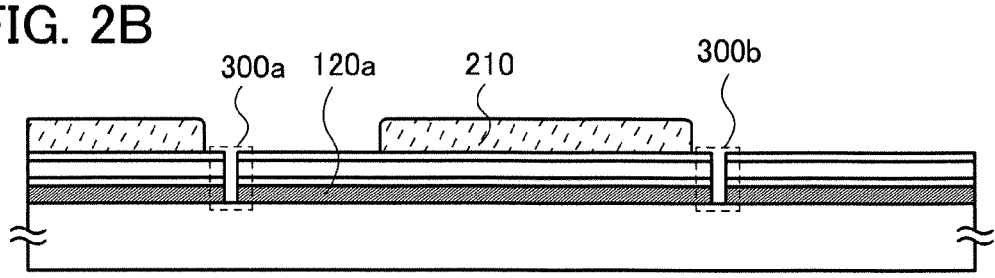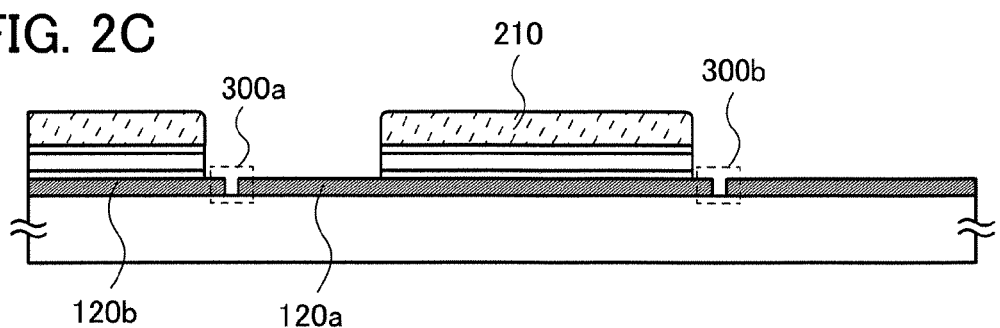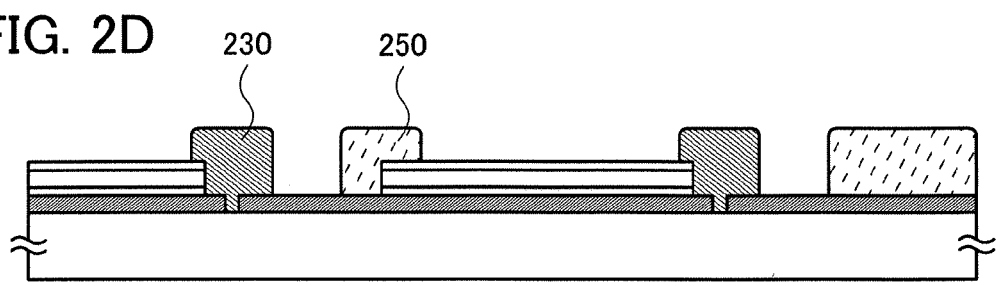

300a    300b

120a

PHOTOELECTRIC CONVERSION DEVICE AND MANUFACTURING METHOD THEREOF

BACKGROUND OF THE INVENTION

1. Field of the Invention

The present invention relates to a photoelectric conversion device and a manufacturing method thereof.

2. Description of the Related Art

Recently, a photoelectric conversion device that generates power without carbon dioxide emissions has attracted attention as a countermeasure against global warming. A typical example of the photoelectric conversion device is a solar cell for supplying residential power or the like, which generates power from sunlight outdoors and in which single crystal silicon, polycrystalline silicon, or the like is used. Further, a thin-film solar cell including amorphous silicon that can be produced at low cost is known.

Although an amorphous-silicon solar cell can be used for supplying residential power or the like, there is a problem in that when the amorphous-silicon solar cell is irradiated with strong light, light deterioration occurs and the initial conversion efficiency decreases. The amorphous-silicon solar cell has a high photoelectric conversion capability with respect to wavelength of visible light such as light of a fluorescent lamp. Accordingly, the amorphous-silicon solar cell is used for operating a device with low power consumption such as a calculator or a wristwatch in many cases.

A thin film photoelectric conversion device is easily processed to have high integration to obtain a desired voltage. An integrated photoelectric conversion device includes an isolation groove that separates stacked semiconductor layers into a plurality of cells. The isolation groove is also used as a connection groove that connects a cell to an adjacent cell in series. The connection groove is provided with a conductive material. Thus, for example in the case where a cell has a pin-type structure, since a side surface portion of each semiconductor layer is in contact with the conductive material provided in the connection groove, the semiconductor layer is short circuited to a rear electrode and an upper electrode. Since each semiconductor layer has high resistance, a current flows in the lateral direction of a cell is very low, a state in which the side surface portion is short-circuited does not become a practical problem. Note that a "cell" in this specification refers to a minimum unit of a photoelectric conversion region that constitutes an integrated photoelectric conversion device.

However, in the case where a cell has a multi-junction type structure such as a tandem type structure, a low resistance layer such as a layer doped at high concentration or a light-transmitting conductive film is used in a region where cells are connected in the vertical direction. Accordingly, when integration is performed in the above-described manner, a leakage current is high and thus favorable electric characteristics cannot be obtained.

To solve this problem, Patent Document 1 discloses a method in which a plurality of first regions (cells) which are to be photoelectric regions and a second region that is positioned between the first regions are formed, and a connection groove is formed in the second region so that short circuit between a semiconductor layer or a light-transmitting conductive film in the first region and a conductive material provided in the connection groove is prevented.

[Reference]
[Patent Document 1] Japanese Published Patent Application No. 2004-260013

SUMMARY OF THE INVENTION

Recent years, a reduction in power consumption of electronic components is developed, and thus electronic devices which can operate by power supplied from only a photoelectric conversion device can be realized. However, in order to successively use such an electronic device indoors, a photoelectric conversion device which can generate power sufficiently even at an illuminance of several tens to several hundreds of lux is needed. To achieve a photoelectric conversion device having high conversion efficiency at low illuminance, short circuit of the side surface portion of a cell cannot be disregarded.

A side surface portion of a cell is short-circuited through not only a conductive material provided in the connection groove. A cell is obtained by separating a semiconductor layer by laser processing, and resistance of a side surface portion of the cell is reduced due to crystallization or improvement in a degree of crystallinity which is caused by heat generated in the laser irradiation. That is, the side surface portion is short-circuited. Since the side surface portion of the cell obtained by laser processing has low resistance, a photoelectric conversion device having high conversion efficiency at low illuminance cannot be realized by only the method disclosed in Patent Document 1.

Therefore, an object of one embodiment of the present invention is to provide a photoelectric conversion device having high conversion efficiency at low illuminance and a manufacturing method thereof.

One embodiment of the present invention relates to a photoelectric conversion device having a high electric generating capacity at low illuminance and a manufacturing method thereof, in which a semiconductor layer is appropriately separated and short circuit of a side surface portion of a cell is prevented.

One embodiment of the present invention disclosed in this specification is a photoelectric conversion device including one first electrode and the other first electrode obtained by separation by an isolation groove, a first stack including, over the one first electrode, one first semiconductor layer having one conductivity type; one second semiconductor layer including an intrinsic semiconductor; and one third semiconductor layer having a conductivity type opposite to the one conductivity type, a second stack including, over the other first electrode, the other first semiconductor layer having the one conductivity type; the other second semiconductor layer including the intrinsic semiconductor; and the other third semiconductor layer having the conductivity type opposite to the one conductivity type, an insulator covering part of the one first electrode, the isolation groove, part of the other first electrode, and a side surface portion of the second stack, a second electrode covering the insulator and electrically connecting the one first electrode and the other third semiconductor layer, and a connection electrode electrically connecting the one first electrode and the second electrode. In the photoelectric conversion device, a side surface portion of one second semiconductor layer and a side surface of the other second semiconductor layer are not crystallized.

In this specification, the ordinal numbers such as "first" and "second" are given for convenience to distinguish between elements, and they are not given to limit the number, the arrangement, or the order of the steps.

In the above stack, an insulating resin may fill a structural defect such as a pinhole or a damaged portion. By filling a structural defect with an insulating resin, short circuit of a cell in the vertical direction due to the structural defect can be prevented.

Note that in this specification, a "structural defect" refers to a defect where a portion of a film is missing, and does not refer to a crystal defect where a crystal structure is disturbed or the like.

A connection electrode for connecting the one first electrode and the second electrode may be formed. The connection electrode may be formed using at conductive resin material having a low resistance selected from a silver paste, a nickel paste, a molybdenum paste, and a copper paste, or a lamination thereof.

Another embodiment of the present invention disclosed in this specification is a photoelectric conversion device including one first electrode and the other first electrode obtained by separation by an isolation groove, a first stack including, over the one first electrode, one first semiconductor layer having one conductivity type; one second semiconductor layer including an intrinsic semiconductor; one third semiconductor layer having a conductivity type opposite to the one conductivity type; and one second electrode, a second stack including, over the other first electrode, the other first semiconductor layer having the one conductivity type; the other second semiconductor layer including the intrinsic semiconductor; the other third semiconductor layer having the conductivity type opposite to the one conductivity type; and the other second electrode, an insulator covering part of the one first electrode, the isolation groove, part of the other first electrode, and a side surface portion of the second stack, and a connection electrode covering the insulator and electrically connecting the one first electrode and the other second electrode. In the photoelectric conversion device, a side surface portion of the second semiconductor layer in not crystallized.

For the connection electrode, a carbon paste, an indium tin oxide paste (an ITO paste), or a conductive resin material that has resistance equivalent to that of the second electrode is preferably used.

In each of the first semiconductor layer and the third semiconductor layer, a crystallinity in a side surface portion is preferably the same as a crystallinity in a central portion.

Another embodiment of the present invention disclosed in this specification is a manufacturing method of a photoelectric conversion device, including the steps of: forming a first conductive layer over a substrate; forming a first semiconductor layer having one conductivity type over the first conductive layer; forming a second semiconductor layer formed using an intrinsic semiconductor over the first semiconductor layer; forming a third semiconductor layer having a conductivity type opposite to the one conductivity type over the second semiconductor layer; forming an isolation groove to separate the first conductive layer, the first semiconductor layer, the second semiconductor layer, and the third semiconductor layer into a plurality of layers, so that one first electrode, the other first electrode, and a stack including the semiconductor layers are formed; performing selective etching on the stack using a first mask formed using a peelable resin so that part of the first electrode is exposed; removing the first mask; sealing the isolation groove and a side surface portion of the etched stack with an insulator; covering another side surface portion of the etched stack and part of the first electrode with a second mask formed using a peelable resin; forming a second conductive layer over the etched stack, the insulator, the first electrode, and the second mask; removing the second mask so that the another side surface portion of the etched stack and the part of the first electrode are exposed and one second electrode and the other second electrode are formed; and forming a connection electrode connecting the one first electrode and the other second electrode.

In the above method, part of the first mask may be fixed in a structural defect formed in the stack.

Another embodiment of the present invention disclosed in this specification is a manufacturing method of a photoelectric conversion device, including the steps of: forming a first conductive layer over a substrate; forming a first semiconductor layer having one conductivity type over the first conductive layer; forming a second semiconductor layer formed using an intrinsic semiconductor over the first semiconductor layer; forming a third semiconductor layer having a conductivity type opposite to the one conductivity type over the second semiconductor layer; forming a second conductive layer over the third semiconductor layer; performing selective etching on the second conductive layer using a mask formed using a peelable resin; forming an isolation groove to separate the first conductive layer, the first semiconductor layer, the second semiconductor layer, the third semiconductor layer, and the second conductive layer into a plurality of layers, so that one first electrode, the other first electrode, a stack including the semiconductor layers, one second electrode, and the other second electrode are formed; performing selective etching on the stack using the mask so that part of the first electrode is exposed; removing the mask; sealing the isolation groove and a side surface portion of the etched stack with an insulator; and forming a connection electrode connecting the one first electrode and the other second electrode.

Another embodiment of the present invention disclosed in this specification is a manufacturing method of a photoelectric conversion device, comprising the steps of: forming a first conductive layer over a substrate; forming a first semiconductor layer having one conductivity type over the first conductive layer; forming a second semiconductor layer formed using an intrinsic semiconductor over the first semiconductor layer; forming a third semiconductor layer having a conductivity type opposite to the one conductivity type over the second semiconductor layer; selectively forming a second conductive layer using a shielding plate over the third semiconductor layer, so that one second electrode and the other second electrode are formed; forming an isolation groove to separate the first conductive layer, the first semiconductor layer, the second semiconductor layer, and the third semiconductor layer into a plurality of layers, so that one first electrode, the other first electrode, and a stack including the semiconductor layers are formed; performing selective etching on the stack using the second electrode as a mask so that part of the first electrode is exposed; sealing the isolation groove and a side surface portion of the etched stack with an insulator; and forming a connection electrode connecting the one first electrode and the other second electrode.

The isolation groove can be formed by laser processing.

According to one embodiment of the present invention, a photoelectric conversion device having a high electric generating capacity even at low illuminance can be provided.

BRIEF DESCRIPTION OF THE DRAWINGS

In the accompanying drawings;

FIGS. 2A to 2D are process cross-sectional views illustrating a method for manufacturing a photoelectric conversion device;

DETAILED DESCRIPTION OF THE INVENTION

Figure 1:
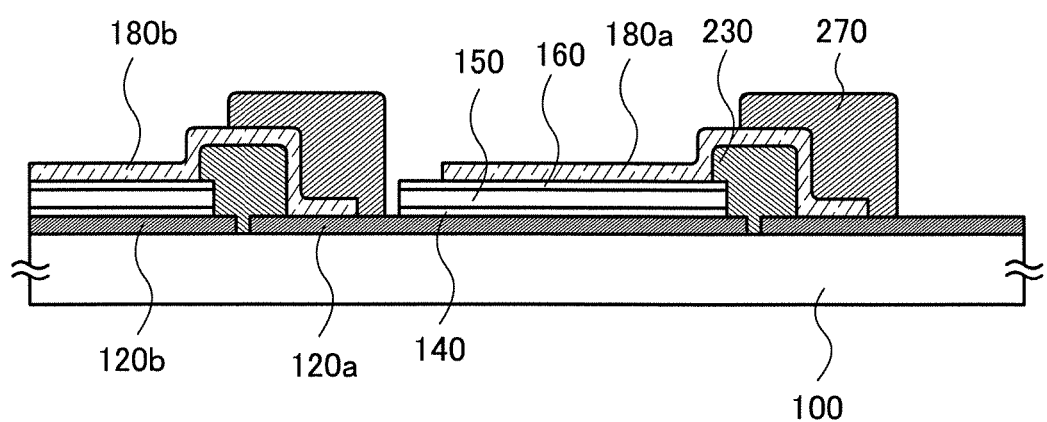
FIG. 1 is a cross-sectional view illustrating a photoelectric conversion device according to one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways. Therefore, the present invention is not construed as being limited to description of the embodiments. Note that in all drawings used to illustrate the embodiments, portions that are identical or portions having similar functions are denoted by the same reference numerals, and their repetitive description may be omitted.
(Embodiment 1)

In this embodiment, a structure and a manufacturing method for a photoelectric conversion device according to one embodiment of the present invention will be described.

FIG. 1 is a cross-sectional view of a photoelectric conversion device according to one embodiment of the present invention. A photoelectric conversion device of this embodiment has an integrated structure including a substrate 100, first electrodes 120a and 120b, a first semiconductor layer 140, a second semiconductor layer 150, a third semiconductor layer 160, second electrodes 180a and 180b, an insulator 230, and a connection electrode 270. Although the connection electrode 270 is not necessarily provided, it is preferable to provide the connection electrode 270 to reduce contact resistance between the first electrode 120a and the second electrode 180b.

Note that a cross-sectional view of a photoelectric conversion device in this specification illustrates part of an integrated photoelectric conversion device, and the number of cells connected in series is not limited and may be determined as appropriate by a practitioner so that a desired power is obtained. A structure of a cell is the same as that of an adjacent cell; thus, the reference numeral of a cell may be omitted in some cases.

Figure 10:
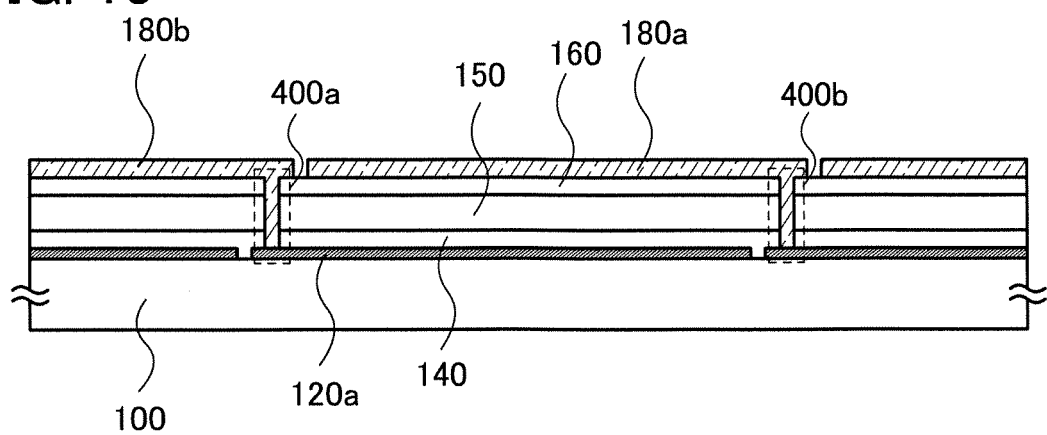
FIG. 10 is a cross-sectional view illustrating a conventional photoelectric conversion device.

FIG. 10 is a cross-sectional view of a conventional integrated photoelectric conversion device. The photoelectric conversion device is a pin-type photoelectric conversion device, and includes the substrate 100, the first electrode 120a, the first semiconductor layer 140, the second semiconductor layer 150, the third semiconductor layer 160, and the second electrodes 180a and 180b. An isolation groove by which the semiconductor layer is separated into a plurality of the semiconductor layers so that cells are formed functions as a connection groove for connecting the first electrode 120a and the second electrode 180b of an adjacent cell. A conductive material included in the second electrodes 180a and 180b fills connection grooves 400a and 400b.

In the connection grooves 400a and 400b, a side surface portion of each semiconductor layer included in a cell is in contact with the conductive material of the connection groove and thus short-circuited with a rear surface electrode or a surface electrode. When a current flowing in the horizontal direction (the plane direction) is much smaller than a current flowing in the vertical direction (the thickness direction) in each semiconductor layer, a state in which the side surface portion of each semiconductor layer is short-circuited does not cause a practical problem. Although the first semiconductor layer 140 and the third semiconductor layer 160 each have a lower resistance as for a semiconductor, the first semiconductor layer 140 and the third semiconductor layer 160 each have a low electric conductivity and a low leakage current as compared with the first electrode or the second electrode formed using metal or an oxide conductive layer.

However, at low illuminance, when a power generation current of a cell is low, the state in which the side surface portion of each semiconductor layer is short-circuited cannot be disregarded. Although depending on the resistance of the first semiconductor layer 140 or the third semiconductor layer 160, a leakage current is increased in a current flowing between electrodes of a cell; thus, electrical characteristics become worse. Specifically, a fill factor (F.F.) or an open circuit voltage (Voc) decreases. Note that "low illuminance" here means illuminance lower limit of which is several tens of lux.

Accordingly, a structure in which the side surface portion of a cell is not in contact with a conductive material is needed, but not enough. A method by which cells are formed by separating a semiconductor layer needs to be improved.

In general, a laser process is employed for a separation process of a semiconductor layer. When a semiconductor layer is irradiated with laser light, absorption of the light causes local heat generation and thus a region of the semiconductor layer irradiated with the laser light disappears. This phenomenon forms an isolation groove in the semiconductor layer, and by heat generated at this time, a side surface portion of the isolation groove, that is, a side surface portion of a cell is crystallized or a degree of crystallinity of the side surface portion of the cell is changed. For example, in the case where the semiconductor layer is an amorphous silicon layer, the side surface portion becomes microcrystalline or polycrystalline silicon in some cases. In the case where the semiconductor layer is a microcrystalline silicon layer, the laser irradiation causes growth of crystal grains in the side surface portion in some cases.

In the case where amorphous silicon is crystallized or microcrystalline silicon is changed to have a higher degree of crystallinity as described above, the electric conductivity increases; thus, the side surface portion of the cell is in a short-circuited state as in the case in which the side surface portion of the cell is in contact with a conductive material.

Note that a "degree of crystallinity" is obtained by quantifying data of a crystal from results of any of analyses such as Raman spectroscopy, X-ray diffraction, measurement of reflectivity, measurement of resistance, and electron microscope observation, and also referred to as a "crystallinity."

Therefore, a photoelectric conversion device according to one embodiment of the present invention has a structure in which a side surface portion of a stack including the first semiconductor layer 140, the second semiconductor layer 150, and the third semiconductor layer 160 is not in contact with a conductive material. Further, a side surface portion of the second semiconductor layer 150 is amorphous, and side surface portions of the first semiconductor layer 140 and the third semiconductor layer 160 each have a degree of crystallinity the same as that of the other portions, for example, the central portion of the semiconductor layer.

In FIG. 1, a side surface portion of the stack is covered with the insulator 230, and a side surface portion facing thereto is in contact with nothing. Although not illustrated, the other side surface portions are also in contact with nothing. A light-receiving surface (a surface where a semiconductor layer and the like are formed) side in FIG. 1 may be sealed with an insulator such as an insulating resin so that the reliability is increased. In that case, the side surface portions except the side surface portion covered with the insulator 230 are in contact with the insulator.

The stack is formed by an etching method by which the side surface portion is not crystallized and the degree of crystallinity is not changed.

With such a structure, short circuit in a side surface portion of a cell can be prevented; thus, a photoelectric conversion device having a high electric generating capacity can be manufactured even at low illuminance.

Figure 5A:
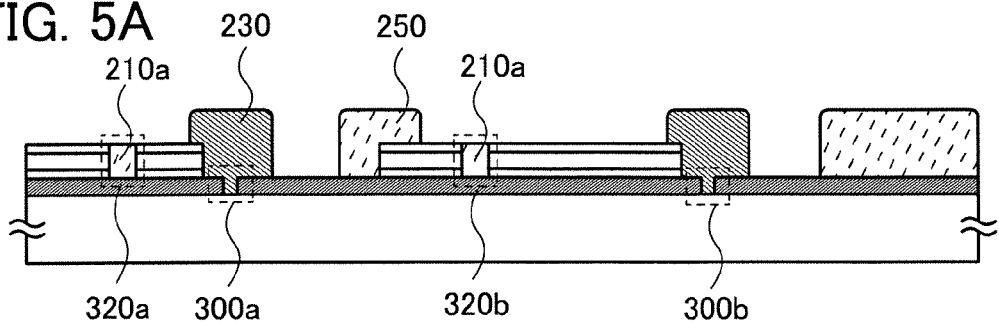
FIGS. 5A to 5D are process cross-sectional views illustrating a method for manufacturing a photoelectric conversion device.
Figure 5B:
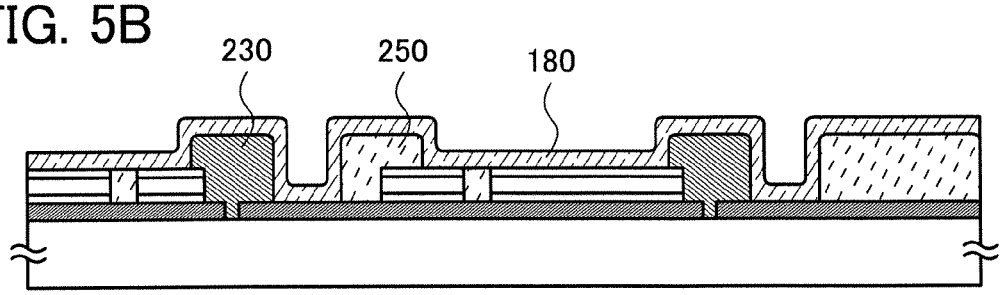
Figure 5C:
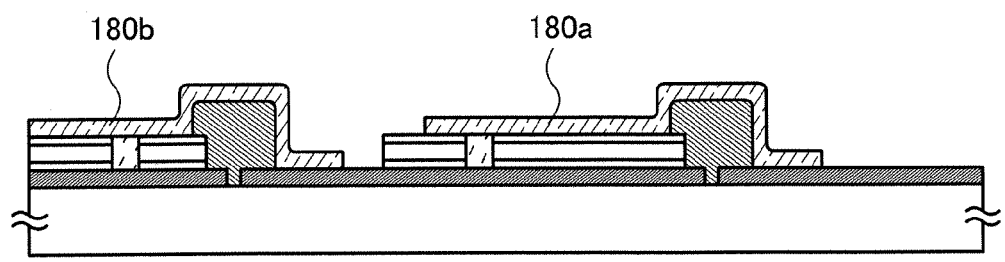
Figure 5D:
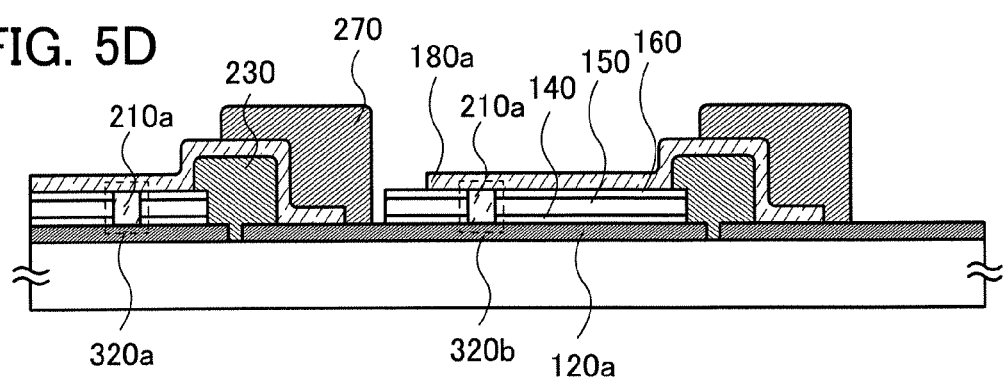

As illustrated in FIG. 5D, structural defects 320a and 320b such as a pinhole or a damaged portion formed in at least one of the first semiconductor layer 140, the second semiconductor layer 150, and the third semiconductor layer 160 may be filled with an insulating resin 210a. With the insulating resin 210a, the structural defects 320a and 320b are inactivated; thus, short circuit between an upper electrode and a lower electrode and a leakage current can be prevented.

The structural defects 320a and 320b are unintentionally formed due to particles or the like in the process for forming the semiconductor layer. Note that although the structural defects 320a and 320b in FIG. 5D each penetrate three semiconductor layers which are the first semiconductor layer 140, the second semiconductor layer 150, and the third semiconductor layer 160, a structure of a structural defect is not limited thereto because a structural defect is formed due to various phenomina. For example, there are a case where a structural defect is formed in a layer above the second semiconductor layer 150 and a case where a structural defect is formed in a region including the first electrode 120a. In any case, a structural defect is a region where a layer to be originally formed is deficient, and another layer is likely to fill into the region. Therefore, electrical characteristics become worse, for example, short circuit, a leakage current, or the like occurs.

For the substrate 100, a glass plate of soda-lime glass, white glass, lead glass, or crystallized glass can be used, for example. Alternatively, a non-alkali glass substrate of aluminosilicate glass, barium borosilicate glass, aluminoborosilicate glass, or the like, or a quartz substrate can be used. In this embodiment, a glass substrate is used as the substrate 100, and the side on which a semiconductor layer is formed is set as a light incidence side.

Alternatively, a resin substrate can be used as the substrate 100. For example, the following are given: polyether sulfone (PES); polyethylene terephthalate (PET); polyethylene naphthalate (PEN); polycarbonate (PC); a polyamide-based synthetic fiber; polyether etherketone (PEEK); polysulfone (PSF); polyether imide (PEI); polyarylate (PAR); polybutylene terephthalate (PBT); polyimide; an acrylonitrile butadiene styrene resin; poly vinyl chloride; polypropylene; poly vinyl acetate; an acrylic resin, and the like.

Note that there in no particular limitation on the thickness of the substrate 100, for example, when the above resin substrate having a thickness of 100 μm is used, a roll-to-roll processing can be performed.

In roll-to-roll processing, in addition to a film formation step by a sputtering method, a plasma CVD method, or the like, a step by a screen printing method, a laser processing method, or the like is included. Accordingly, almost the entire manufacturing process of a photoelectric conversion device can be performed by roll-to-roll processing. Furthermore, the process may partially be performed by roll-to-roll processing, and then divided into sheet forms to perform latter steps individually for each sheet. For example, by attaching each piece of the divided sheet to a frame that is formed of ceramic, metal, a composite body thereof, or the like, it can be handled in the same manner as a glass substrate or the like.

Also, for the first electrode 120a, a metal film of aluminum, titanium, nickel, silver, molybdenum, tantalum, tungsten, chromium, copper, stainless steel, or the like can be used. The metal film is not limited to a single layer, and different films may be laminated. For example, a lamination of a stainless steel film and an aluminum film, a lamination of a silver film and an aluminum film, or the like can be used. A total film thickness is to be 100 nm or more and 600 nm or less, preferably 100 nm or more and 300 nm or less. Also, although not illustrated, a surface of the first electrode 120a may have a textured structure so as to give a light-trapping effect.

As the second electrode 180a, a light-transmitting conductive film containing the following can be used: indium tin oxide (ITO); indium tin oxide containing silicon (ITSO); zinc oxide (ZnO); indium tin oxide containing zinc (IZO); zinc oxide containing gallium (GZO); zinc oxide containing aluminum (AZO); tin oxide ($SnO_2$); tin oxide containing fluorine (FTO); tin oxide containing antimony (ATO); or the like. The above light-transmitting conductive film is not limited to a single layer, and different films may be laminated. For example, a lamination of an ITO film and an AZO film, a lamination of an ITO film and an FTO film, or the like can be used. A film thickness is to be 100 nm or more and 1000 nm or less.

Note that the first electrode 120a may be a lamination of the above light-transmitting conductive film and a metal film. In this case, by having the light-transmitting conductive film on a side that is in contact with a semiconductor layer, a light-trapping effect can be given. Here, the thickness of the light-transmitting conductive film is preferably 10 nm or more and 100 nm or less. For example, a lamination in which an aluminum film, a silver film, and an ITO film are formed in this order from the substrate side can be used.

Since the side opposite to the substrate 100 side is set as the light incidence side in this embodiment, a lamination of a stainless steel film and an aluminum film is used for the first electrode 120a, and an ITO film which is a light-transmitting conductive film is used for the second electrode 180a. In the case where the substrate 100 side is set as the light incidence side, materials used for the electrodes may be reversed. Note that although a light-transmitting conductive film is used for an electrode on the light incidence side, a type of an opposing electrode is not limited, and the practitioner may appropriately select the type of electrode to be used.

For the first semiconductor layer 140, a semiconductor film having one conductivity type can be used, and for the third semiconductor layer 160, a semiconductor film having a conductivity type opposite to the one conductivity can be used. In this embodiment, although an n-type silicon semiconductor film is used for the first semiconductor layer 140 and a p-type silicon semiconductor film is used for the third semiconductor layer 160, conductivity types may be reversed. Note that the film thickness of the first semiconductor layer 140 is preferably 10 nm or more and 30 nm or less, and the film thickness of the third semiconductor layer 160 is preferably 5 nm or more and 30 nm or less. Furthermore, although amorphous silicon can be used for the first semiconductor layer 140 and the third semiconductor layer 160, microcrystalline silicon or polycrystalline silicon that has lower resistance is preferably used.

For the second semiconductor layer 150, an intrinsic semiconductor is used. Note that in this specification, an "intrinsic semiconductor" refers not only to a so-called intrinsic semiconductor in which the Fermi level lies in the middle of a band gap, but also to a semiconductor in which a concentration of an impurity imparting p-type or n-type conductivity is $1\times10^{20}$ cm$^{-3}$ or lower, and in which photoconductivity is 100 times or more than a dark conductivity. This intrinsic semiconductor may include an element belonging to Group 13 or Group 15 of the periodic table as an impurity element. Note that the film thickness of the second semiconductor layer 150 is preferably 100 nm or more and 600 nm or less.

A preferable intrinsic semiconductor used for the second semiconductor layer 150 is amorphous silicon. The optical absorption of visible light into amorphous silicon is high; thus, a photoelectric conversion device having a high electric generating capacity in an environment at low illuminance, for example, under a fluorescent lighting can be manufactured.

Next, a manufacturing method for a photoelectric conversion device according to one embodiment of the present invention will be described in detail.

First, a conductive film 120 to be the first electrode 120a is formed over the substrate 100 that is a glass substrate, for example. Here, a layer obtained by stacking a 5-nm-thick stainless steel layer and a 300-nm-thick aluminum layer by a sputtering method is used. Note that the stainless steel layer is in contact with the first semiconductor layer 140.

Next, as the first semiconductor layer 140, a 30-nm-thick n-type microcrystalline silicon layer is formed. In this embodiment, a doping gas containing an impurity imparting n-type conductivity is mixed into a source gas, and a n-type microcrystalline silicon film is formed by a plasma CVD method. Typical examples of the impurity imparting n-type conductivity are phosphorus, arsenic, and antimony which are elements belonging to Group 15 in the periodic table. For example, a doping gas such as phosphine is mixed into a source gas such as silane, so that an n-type microcrystalline silicon layer can be formed. For the first semiconductor layer 140, although amorphous silicon may be used, microcrystalline silicon is preferably used because it has lower resistance and adhesiveness between microcrystalline silicon and the conductive film 120 is favorable.

Next, as the second semiconductor layer 150, a 600-nm-thick i-type amorphous silicon layer is formed by a plasma CVD method. As a source gas, silane or disilane can be used, and hydrogen may be added thereto. At this time, an atmospheric component contained in the layer serves as a donor in some cases; thus, boron (B) may be added to the source gas so that the conductivity type is closer to i-type. In that case, the concentration of boron in the i-type amorphous silicon is controlled to greater than or equal to 0.001 at. % and less than or equal to 0.1 at. %.

Further, as a third semiconductor layer 160, a 30-nm-thick p-type microcrystalline silicon layer is formed by a plasma CVD method (see FIG. 2A). A doping gas containing an impurity imparting p-type conductivity is mixed into a source gas, so that the p-type microcrystalline silicon layer is formed. Typical examples of the impurity imparting p-type conductivity are boron and aluminum which are elements belonging to Group 13 in the periodic table. For example, a doping gas such as diborane is mixed into a source gas such as silane, so that a p-type microcrystalline silicon layer can be formed. For the third semiconductor layer 160, although amorphous silicon may be used, microcrystalline silicon is preferably used because it has lower resistance.

Next, a mask 210 is formed to cover a region to be a cell. A peelable resin is preferably used for the mask 210. A peelable resin is made of a vinyl chloride material, a vinyl acetate material, an acrylic resin material, or the like. The peelable resin is also referred to as a peelable masking agent, and an example thereof is stripmask #503B-SH (produced by Asahi Chemical Research Laboratory Co., Ltd.). The peelable resin has features that it can directly form a mask having a desired shape by screen printing or the like, and can be physically easily peeled without a stripper solution or the like. Note that as the peelable resin, a photosensitive resin such as a photoresist or photosensitive polyimide may be used.

Next, isolation grooves 300a and 300b are formed so that the conductive film 120, the first semiconductor layer 140, the second semiconductor layer 150, and the third semiconductor layer 160 are separated into a plurality of layers (see FIG. 2B). The isolation grooves can be formed by laser processing or the like. A laser used in this laser processing is preferably a continuous wave laser or a pulsed laser which emits light in an infrared light region. For example, the laser processing may be performed using an Nd-YAG laser (wavelength of 1064 nm) with a beam diameter of 30 μm, an output of 0.5 W, an oscillation frequency of 25 kHz, and a scanning speed of 20 cm/sec. Note that here, a portion of the separation grooves may reach the substrate 100. In this step, the conductive film 120 is processed to be separated, so that the first electrodes 120a and 120b are formed.

In a side surface portion of each of the isolation grooves 300a and 300b, a semiconductor layer region is heated by the laser processing; thus, an amorphous region is crystallized and a microcrystalline region is changed in the degree of crystallinity. Note that in the case where the microcrystalline layer with relatively high degree of crystallinity is formed, the degree of crystallinity in the microcrystalline region is not changed in some cases.

Note that the formation of the mask 210 over the region to be a cell can prevent scattered matters or the like from being directly put on a cell during laser processing. When scattered matters are put on a film, the scattered matters may cause structural defects such as blemishes.

Next, the semiconductor layers except the semiconductor layers in a region covered with the mask 210 are removed by etching (see FIG. 2C). Etching of the semiconductor layers can be performed by, for example, a dry etching method in which $SF_6$, $CHF_3$, $CF_4$, $NF_3$, or $ClF_3$ is used as an etching gas, or a wet etching method in which an aqueous solution of hydrazine ($N_2H_4$), potassium hydroxide (KOH), or tetramethyl ammonium hydroxide (TMAH) is used.

In this step, regions of the crystallized semiconductor layers in the side surfaces of the isolation grooves 300a and 300b are removed. In addition, parts of the first electrodes 120a and 120b are exposed.

The step of laser processing and the step of etching the semiconductor layers may be interchanged. However, since a semiconductor layer absorbs larger amount of laser light than a metal layer, the above-described order is preferable in terms of a processing efficiency.

Next, the mask 210 is removed. After that, an insulator 230 is formed to cover a side surface portion of a stack including the first semiconductor layer 140, the second semiconductor layer 150, and the third semiconductor layer 160, so that the isolation grooves 300a and 300b are filled. Further, a mask 250 is formed to cover another side surface portion of the stack (see FIG. 2D).

For the insulator 230, an inorganic material such as metal oxide, or an insulating resin such as an epoxy resin, a phenol resin, an acrylic resin, a silicone resin, or a polyimide resin can be used. For example, the insulator 230 can be formed using a thermosetting epoxy resin by a screen printing method. A peelable resin applicable to the mask 210 can be used for the mask 250.

Figure 3A:
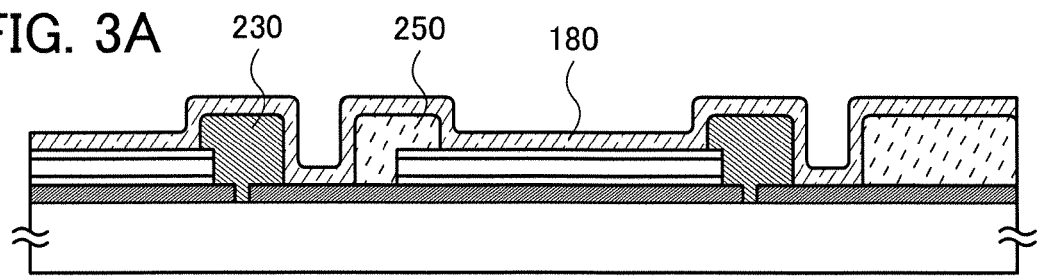
FIGS. 3A to 3C are process cross-sectional views illustrating a method for manufacturing a photoelectric conversion device.

Next, a light-transmitting conductive film 180 is formed to cover the third semiconductor layer 160, the insulator 230, and the mask 250 (see FIG. 3A). Here, as the light-transmitting conductive film 180, indium tin oxide (ITO) is deposited to 100 nm by a sputtering method.

Figure 3B:
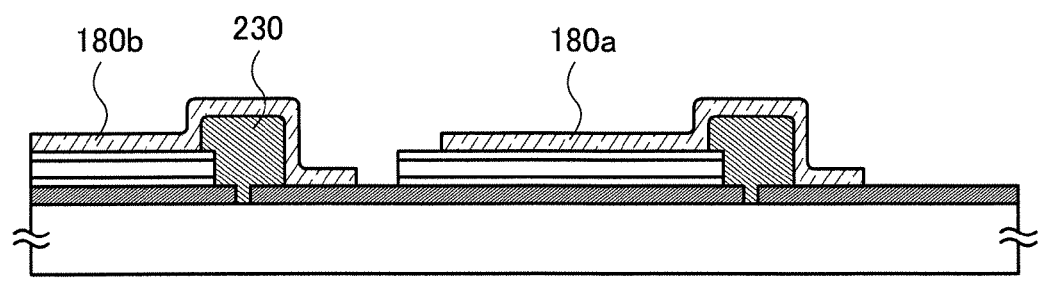

Then, a lift-off process in which the mask 250 and the light-transmitting conductive film 180 formed over the mask 250 are removed is performed so that the another side surface portion of the stack including the first semiconductor layer 140, the second semiconductor layer 150, and the third semiconductor layer 160 is in contact with nothing (see FIG. 3B). At this time, the second electrodes 180a and 180b are formed.

Figure 3C:
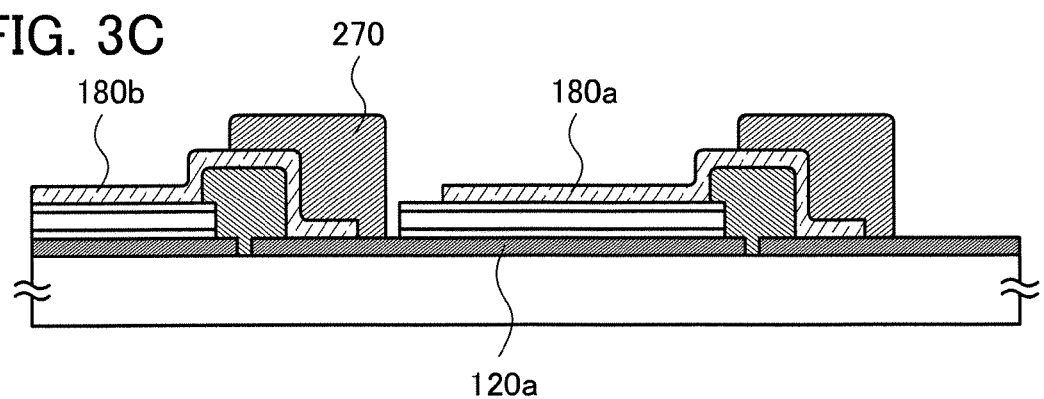

After that, the connection electrode 270 which connects the first electrode 120a and the second electrode 180b that is formed over the stack over the first electrode 120b that is adjacent to the first electrode 120a is formed (see FIG. 3C). For the connection electrode 270, one selected from a silver paste, a nickel paste, a molybdenum paste, and a copper paste, or a lamination thereof can be used. Here, the connection electrode 270 is formed using a silver paste by a screen printing method. Here, an end portion of the connection electrode 270 that is in contact with the second electrode 180b overlaps with the insulator 230. When the end portion of the connection electrode 270 is formed across the insulator 230 and covers a region where a cell is formed, a light receiving area is reduced and further, electrostatic withstand voltage is decreased in some cases.

Although not illustrated, a protective insulating layer may be formed on the light receiving area side so as to increase the reliability. An inorganic film or an insulating resin can be used for the protective insulating layer.

In the above-described manner, short circuit in a side surface portion of a cell can be prevented; thus, a photoelectric conversion device having a high electric generating capacity can be manufactured even at low illuminance.

Next, a manufacturing method for a photoelectric conversion device will be described. The manufacturing method includes a method in which in the case where a semiconductor layer has a structural defect such as a pinhole or a damaged portion, the structural defect is filled with an insulating resin to be inactivated.

Figure 4A:
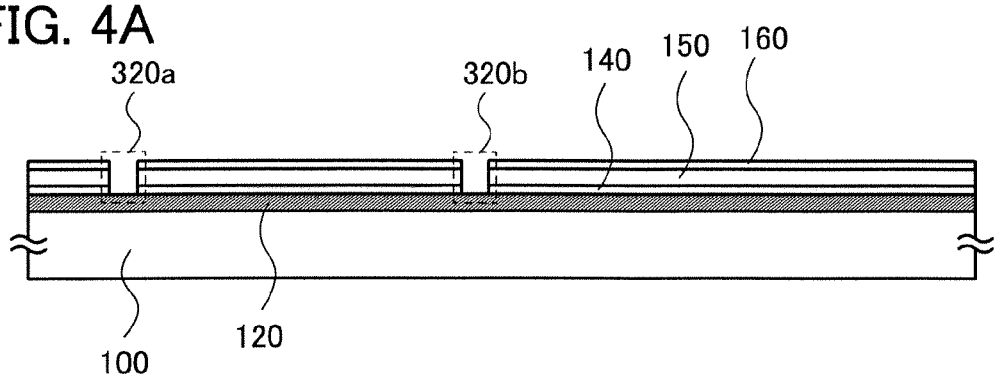
FIGS. 4A to 4D are process cross-sectional views illustrating a method for manufacturing a photoelectric conversion device.

First, the conductive film 120, the first semiconductor layer 140, the second semiconductor layer 150, and the third semiconductor layer 160 are formed over the substrate 100 (see FIG. 4A). These components can be formed according to the manufacturing method of the structure illustrated in FIG. 2A. However, the structural defects 320a and 320b are formed in the semiconductor layers in FIG. 4A.

Next, the mask 210 covering a region to be a cell is formed using an insulating peelable resin. The peelable resin fills the structural defects 320a and 320b. In this embodiment, the mask 210 is formed using a positive photoresist (hereinafter referred to as a photoresist). The mask 210 is formed to have a thickness greater than or equal to 0.5 µM and less than or equal to 5 µm with a spin coater or a slit coater, and then subjected to pre-baking. Note that photosensitive polyimide may be used instead of a photoresist.

Figure 4B:
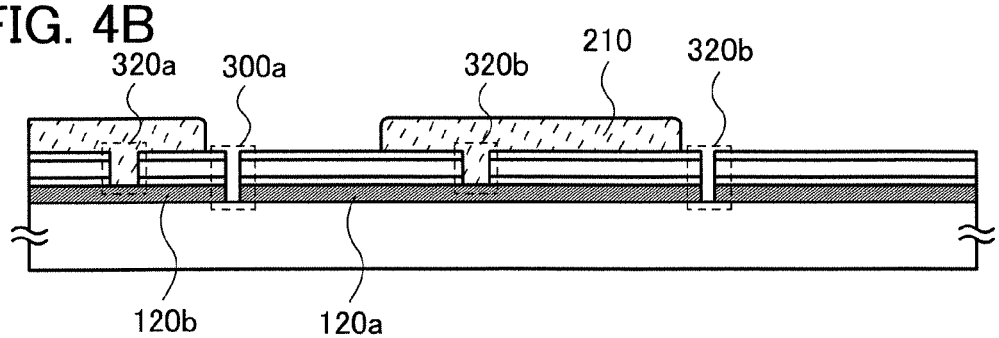

Then, the isolation grooves 300a and 300b are formed (see FIG. 4B). The isolation grooves can be formed according to the manufacturing method of the isolation grooves 300a and 300b in FIG. 2B. In this step, the conductive film 120 is separated, so that the first electrodes 120a and 120b are formed.

Figure 4C:
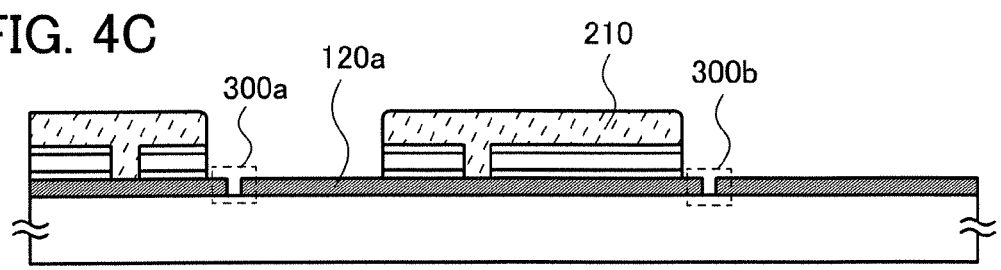

Next, the semiconductor layers except the semiconductor layers in a region covered with the mask 210 are removed by etching (see FIG. 4C). The semiconductor layers can be etched by the etching method employed for forming the structure illustrated in FIG. 2C. In this step, parts of the first electrodes 120a and 120b are exposed.

Next, the photoresist used for the mask 210 is exposed to ultraviolet light with a wavelength greater than or equal to 300 nm and less than or equal to 400 nm. The light exposure is performed on the photoresist side, and the light exposure time is adjusted so that the photoresist up to a surface of the third semiconductor layer 160 is exposed. In that case, an unexposed portion is fixed and an exposed portion is not fixed.

Figure 4D:
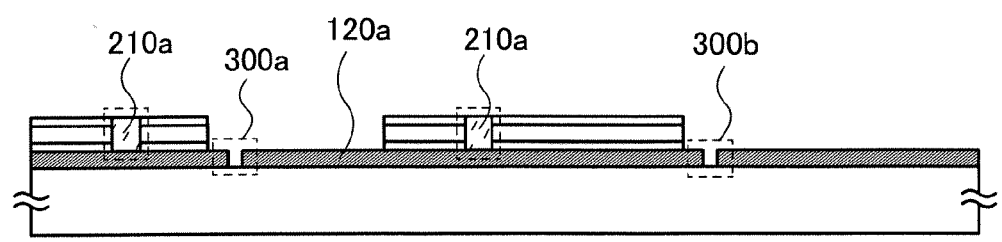

Next, development is performed with a developing solution, whereby the unfixed photoresist can be removed while the fixed photoresist (the insulating resin 210a) remains in the structural defects 320a and 320b. Then, post-baking is performed so that the photoresist (the insulating resin 210a) is chemically stabilized (see FIG. 4D).

After that, the insulator 230 and the mask 250 are formed (see FIG. 5A). These components can be formed according to the formation method of the insulator 230 and the mask 250 included in the structure illustrated in FIG. 2D.

Next, the light-transmitting conductive film 180 is formed to cover the third semiconductor layer 160, the insulator 230, and the mask 250 (see FIG. 5B). The light-transmitting conductive film can be formed according to the formation method of the light-transmitting conductive film 180 included in the structure in FIG. 3A.

Then, a lift-off process in which the mask 250 and the light-transmitting conductive film 180 formed over the mask 250 are removed is performed so that the another side surface portion of the stack including the first semiconductor layer 140, the second semiconductor layer 150, and the third semiconductor layer 160 is in contact with nothing (see FIG. 5C). At this time, the second electrodes 180a and 180b are formed.

After that, the connection electrode 270 which connects the first electrode 120a and the second electrode 180b that is formed over the stack over the first electrode 120b that is adjacent to the first electrode 120a is formed (see FIG. 5D). The connection electrode can be formed according to the formation method of the connection electrode 270 included in the structure in FIG. 3C.

Although not illustrated, a protective insulating layer may be formed on the light receiving area side so as to increase the reliability. An inorganic film or an insulating resin can be used for the protective insulating layer.

Through the above steps, a photoelectric conversion device having a high electric generating capacity even at low illuminance can be manufactured.

This embodiment can be implemented in appropriate combination with the structures described in the other embodiments.

(Embodiment 2)

In this embodiment, an example of a manufacturing method of a photoelectric conversion device which has a structure similar to that of the photoelectric conversion device described in Embodiment 1, which is easier than that described in Embodiment 1, will be described.

Figure 6A:
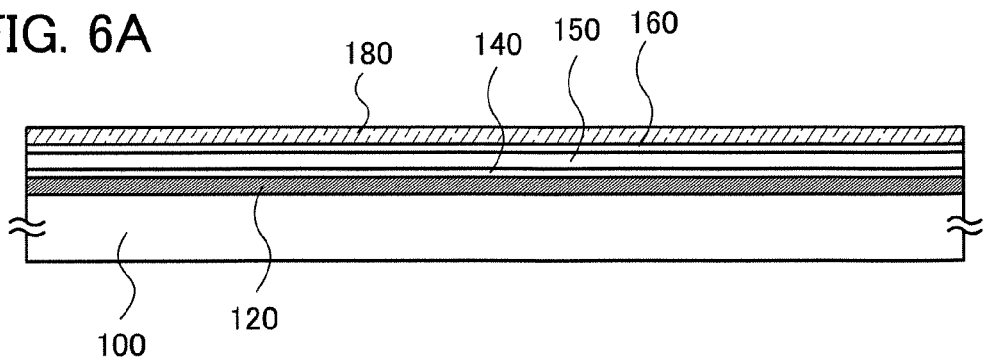
FIGS. 6A to 6D are process cross-sectional views illustrating a method for manufacturing a photoelectric conversion device.

First, the conductive film 120, the first semiconductor layer 140, the second semiconductor layer 150, and the third semiconductor layer 160 are formed over the substrate 100. These components can be formed according to the manufacturing method of the structure illustrated in FIG. 2A in Embodiment 1. Further, ITO is deposited over the third semiconductor layer 160 as the light-transmitting conductive film 180 (see FIG. 6A). The light-transmitting conductive film can be formed according to the formation method of the light-transmitting conductive film 180 included in the structure in FIG. 3A in Embodiment 1.

Figure 6B:
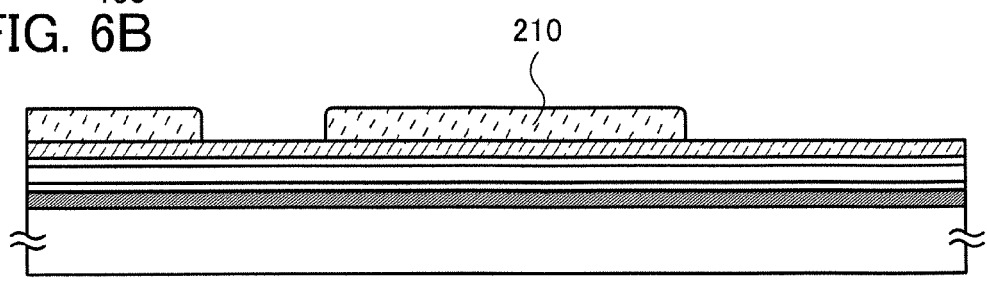

Next, the mask 210 is formed in a region to be a cell (see FIG. 6B). The mask can be formed according to the manufacturing method of the mask 210 included in the structure in FIG. 2B in Embodiment 1.

Figure 6C:
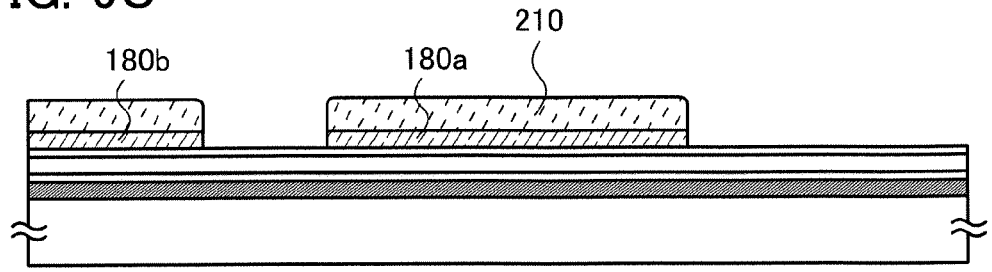

Then, the light-transmitting conductive film 180 except the light-transmitting conductive film 180 in a region covered with the mask 210 is etched, so that the second electrodes 180a and 180b are formed (see FIG. 6C). The etching of ITO can be performed by, for example, a dry etching method in which hydrocarbon or hydrogen halide is used, or a wet etching method in which an oxalic acid-based mixed etchant (e.g., ITO-07N produced by KANTO CHEMICAL CO., INC.) or 0.5% hydrofluoric acid is used.

Figure 6D:
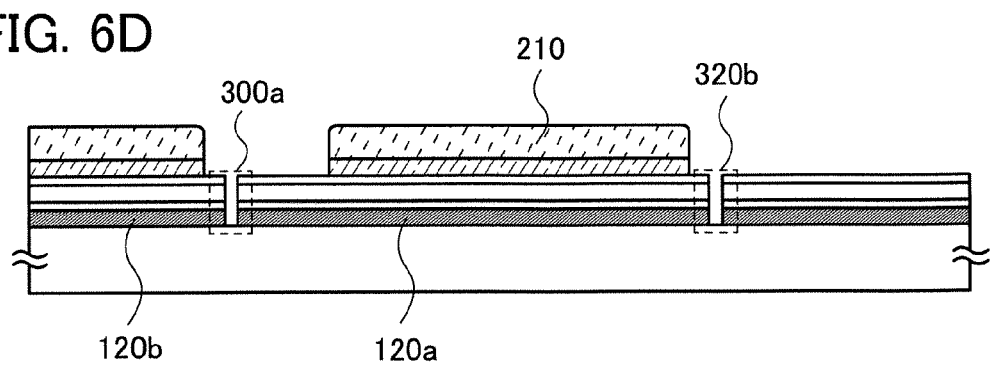

Next, the isolation grooves 300a and 300b are formed so that the conductive film 120, the first semiconductor layer 140, the second semiconductor layer 150, and the third semiconductor layer 160 are separated into a plurality of layers (see FIG. 6D). At this time, the first electrodes 120a and 120b are formed. The isolation grooves can be formed according to the manufacturing method of the isolation grooves 300a and 300b included in the structure in FIG. 2B in Embodiment 1.

In a side surface portion of each of the isolation grooves 300a and 300b, a semiconductor layer region is heated by the laser processing; thus, an amorphous region is crystallized and a microcrystalline region is changed in the degree of crystallinity. Note that in the case where the microcrystalline layer with relatively high degree of crystallinity is formed, the degree of crystallinity in the microcrystalline region is not changed in some cases.

Note that the formation of the mask 210 over the region to be a cell can prevent scattered matters or the like from being directly put on a cell during laser processing. When scattered matters are put on a film, the scattered matters may cause structural defects such as blemishes.

Figure 7A:
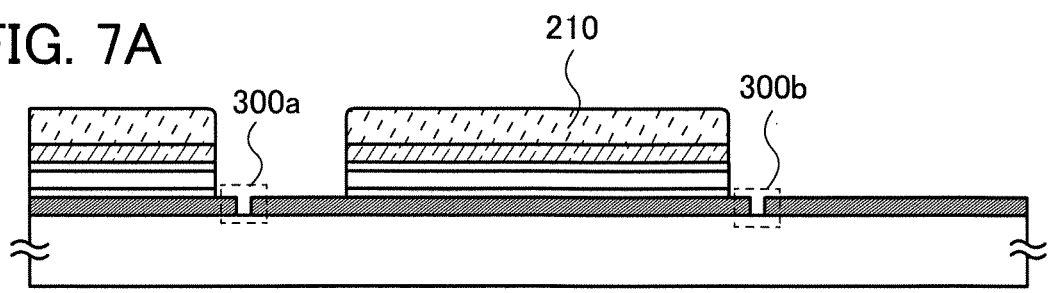
FIGS. 7A to 7C are process cross-sectional views illustrating a method for manufacturing a photoelectric conversion device.

Next, the semiconductor layers except the semiconductor layers in a region covered with the mask 210 and the second electrodes 180a and 180b are removed by etching (see FIG. 7A). The semiconductor layers can be etched by the etching method employed for forming the structure illustrated in FIG. 2C in Embodiment 1.

In this step, regions of the crystallized semiconductor layers in the side surfaces of the isolation grooves 300a and 300b are removed. In addition, parts of the first electrodes 120a and 120b are exposed.

Figure 7B:
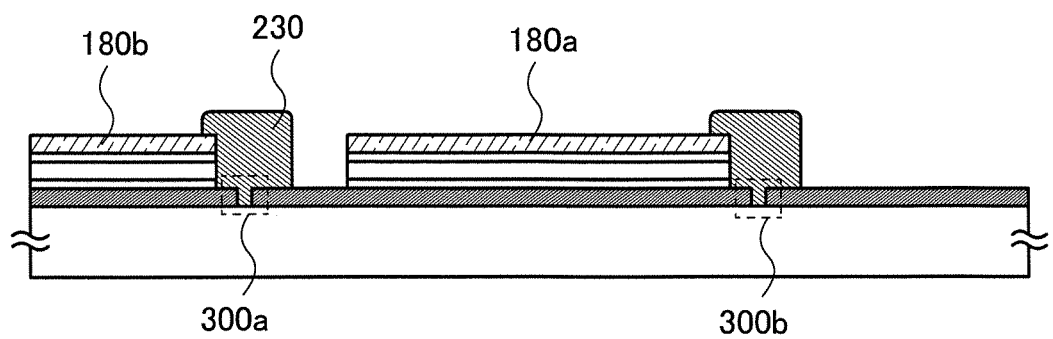

Next, the mask 210 is removed. After that, the insulators 230 are formed to cover a side surface portion of a stack including the first semiconductor layer 140, the second semiconductor layer 150, the third semiconductor layer 160, and the second electrode 180a and a side surface portion of a stack including the first semiconductor layer 140, the second semiconductor layer 150, the third semiconductor layer 160, and the second electrode 180b, so that the isolation grooves 300a and 300b are filled (see FIG. 7B). The insulators can be formed according to the manufacturing method of the insulator 230 included in the structure in FIG. 2D in Embodiment 1.

Figure 7C:
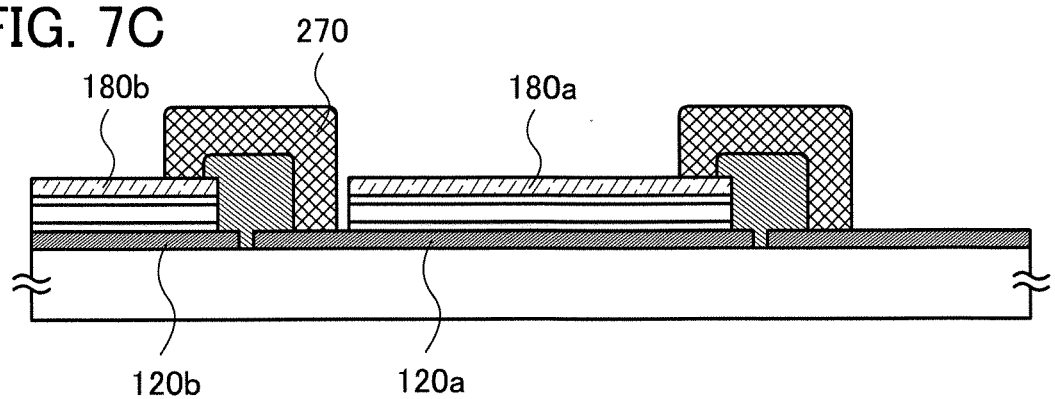

After that, the connection electrode 270 which connects the first electrode 120a and the second electrode 180b that is formed over the stack over the first electrode 120b that is adjacent to the first electrode 120a is formed (see FIG. 7C). For the connection electrode 270, a carbon paste, an ITO paste, or a conductive material that has resistance equivalent to that of the second electrode can be used. Here, the connection electrode 270 is formed using a carbon paste by a screen printing method. When a material having a low resistance such as a silver paste is used for the connection electrode 270, electrostatic withstand voltage is decreased in some cases; therefore, the above-described material having resistance equivalent to that of the second electrode is preferably used for the connection electrode 270.

Although not illustrated, a protective insulating layer may be formed on the light receiving area side so as to increase the reliability. An inorganic film or an insulating resin can be used for the protective insulating layer.

In the above-described manner, short circuit in a side surface portion of a photoelectric conversion device can be prevented; thus, the photoelectric conversion device having a high electric generating capacity can be manufactured even at low illuminance.

A manufacturing method of a photoelectric conversion device, which is obtained by simplifying the above-described manufacturing method, will be described.

Figure 8A:
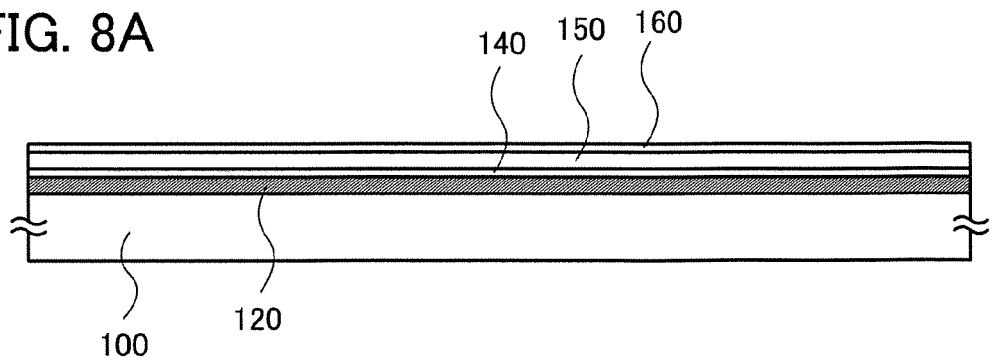
FIGS. 8A to 8D are process cross-sectional views illustrating a method for manufacturing a photoelectric conversion device.

First, the conductive film 120, the first semiconductor layer 140, the second semiconductor layer 150, and the third semiconductor layer 160 are formed over the substrate 100 (see FIG. 8A). These components can be formed according to the manufacturing method of the structure in FIG. 2A in Embodiment 1.

Figure 8B:
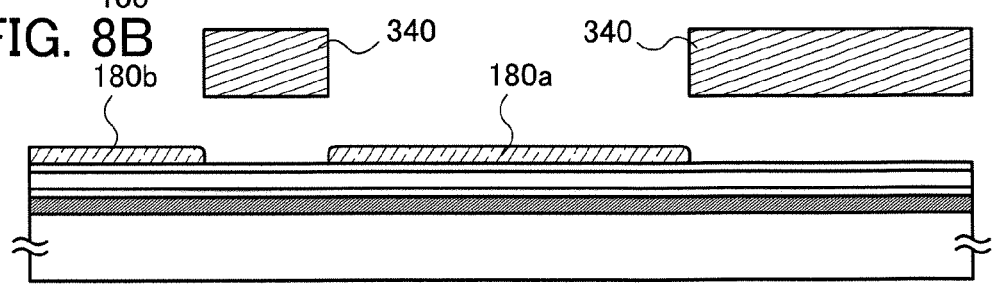

Next, with use of shielding plates 340, the light-transmitting conductive films (the second electrodes 180a and 180b) are formed in only regions to be cells (see FIG. 8B). Although a typical example of the shielding plate 340 is a metal mask, the shielding plate 340 may be formed using a material other than metal. Here, the shielding plates are formed over the semiconductor layers, and ITO is deposited by a sputtering method, so that the second electrodes 180a and 180b are formed.

Figure 8C:
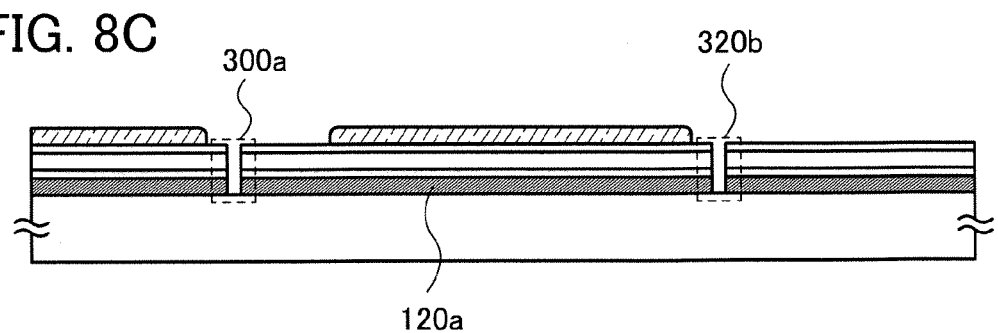

Next, the isolation grooves 300a and 300b are formed so that the conductive film 120, the first semiconductor layer 140, the second semiconductor layer 150, and the third semiconductor layer 160 are separated into a plurality of layers (see FIG. 8C). At this time, the first electrodes 120a and 120b are formed. The isolation grooves can be formed according to the manufacturing method of the isolation grooves 300a and 300b included in the structure in FIG. 2B in Embodiment 1.

In a side surface portion of each of the isolation grooves 300a and 300b, a semiconductor layer region is heated by the laser processing; thus, an amorphous region is crystallized and a microcrystalline region is changed in the degree of crystallinity. Note that in the case where the microcrystalline layer with relatively high degree of crystallinity is formed, the degree of crystallinity in the microcrystalline region is not changed in some cases.

Figure 8D:
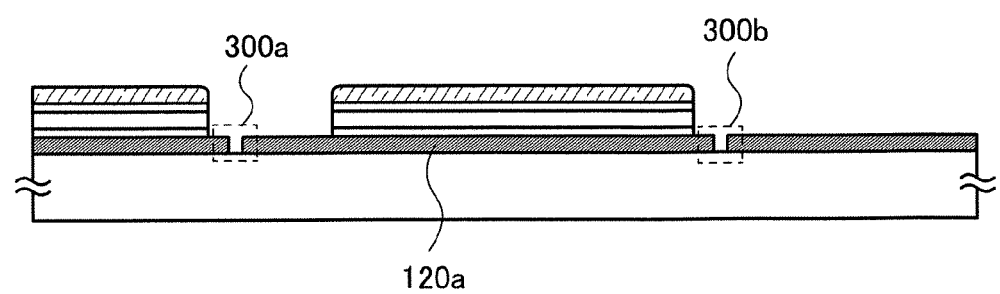

Next, by using the second electrodes 180a and 180b as masks, the semiconductor layers except the semiconductor layers in a region covered with the second electrodes 180a and 180b are removed by etching (see FIG. 8D). The semiconductor layers can be etched by the etching method employed for forming the structure in FIG. 2C in Embodiment 1. Note that in the case where the semiconductor layers are etched by dry etching, ITO used as the second electrodes 180*a* and 180*b* is etched in some cases, there is no problem for using ITO as a mask because the selectivity of ITO to the semiconductor layer is low.

In this step, regions of the crystallized semiconductor layers in the side surfaces of the isolation grooves 300*a* and 300*b* are removed. In addition, parts of the first electrodes 120*a* and 120*b* are exposed.

Figure 9A:
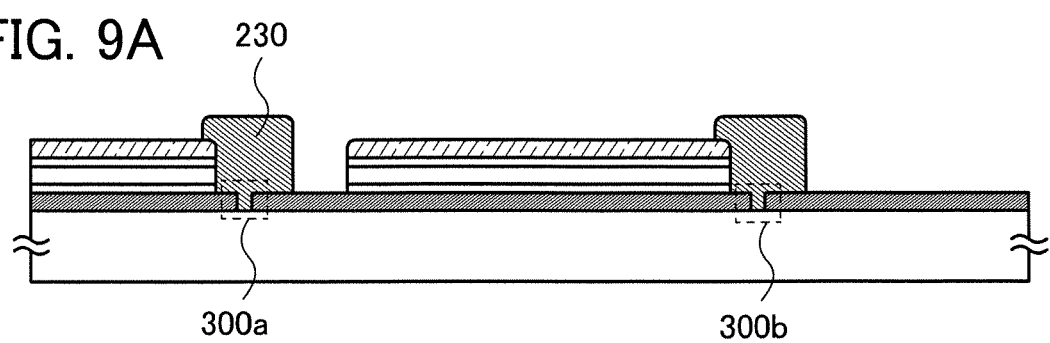
FIGS. 9A and 9B are process cross-sectional views illustrating a method for manufacturing a photoelectric conversion device.

Next, the insulators 230 are formed to cover a side surface portion of a stack including the first semiconductor layer 140, the second semiconductor layer 150, the third semiconductor layer 160, and the second electrode 180*a* and a side surface portion of a stack including the first semiconductor layer 140, the second semiconductor layer 150, the third semiconductor layer 160, and the second electrode 180*b*, so that the isolation grooves 300*a* and 300*b* are filled (see FIG. 9A). The insulators can be formed according to the manufacturing method of the insulator 230 included in the structure in FIG. 2D in Embodiment 1.

Figure 9B:
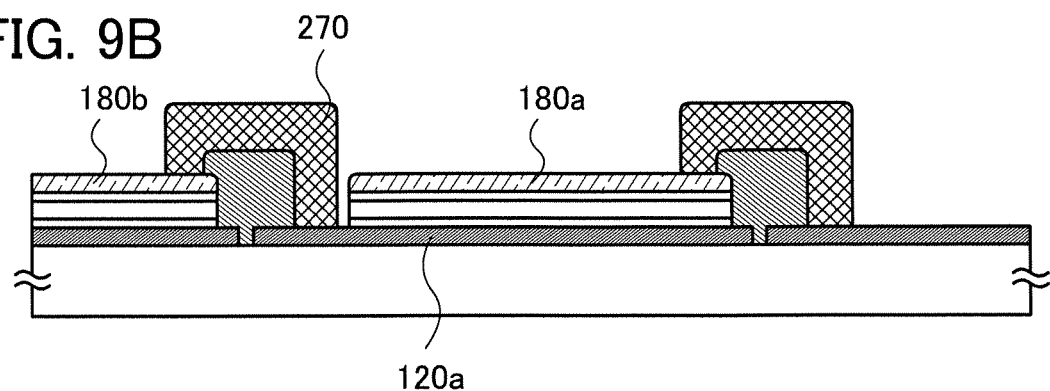

After that, the connection electrode 270 which connects the first electrode 120*a* and the second electrode 180*b* that is formed over the stack over the first electrode 120*b* that is adjacent to the first electrode 120*a* is formed (see FIG. 9B). The connection electrode can be formed according to the manufacturing method of the connection electrode 270 included in the structure in FIG. 7C.

Although not illustrated, a protective insulating layer may be formed on the light receiving area side so as to increase the reliability. An inorganic film or an insulating resin can be used for the protective insulating layer.

In the above manner, short circuit in a side surface portion of a cell can be prevented; thus, a photoelectric conversion device having a high electric generating capacity can be manufactured even at low illuminance.

This embodiment can be implemented in appropriate combination with the structures described in the other embodiments.

(Embodiment 3)

A photoelectric conversion device disclosed in this specification can be used in various electronic devices. In this embodiment, an example of using the photoelectric conversion device as a power source of an electronic book will be described.

Figure 11A:
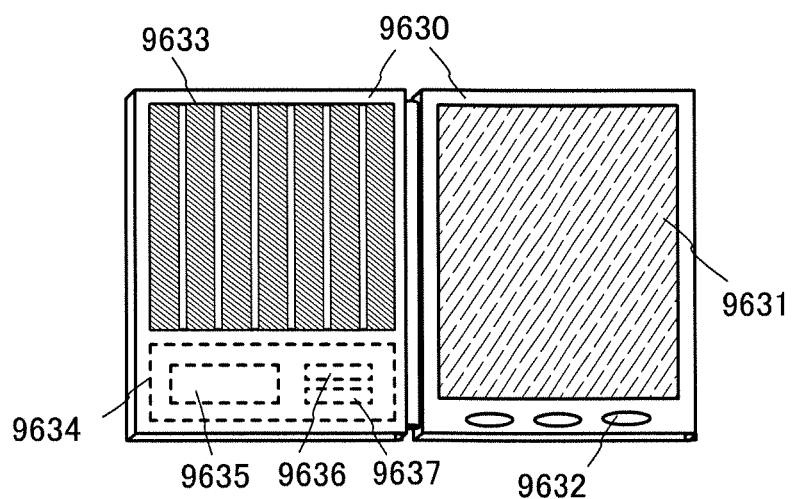
FIG. 11A is a view illustrating an electronic device and FIG. 11B is a block diagram illustrating a charge and discharge control circuit.

FIG. 11A shows an electronic book (also called an "E-book"), which can include a housing 9630, a display portion 9631, an operation key 9632, a photoelectric conversion device 9633, and a charge and discharge control circuit 9634. The electronic book shown in FIG. 11A can have a function of displaying various data (such as a still image, a moving image, and a text image), a function of displaying a calendar, a date, a time, or the like on the display portion, a function of operating or editing the data displayed on the display portion, a function of controlling processing by various software (programs), and the like. Note that FIG. 11A shows an example of a structure of the charge and discharge control circuit 9634 that includes a battery 9635, a DCDC converter 9636, and a DCDC converter 9637. By using the photoelectric conversion device described in the other embodiment as the photoelectric conversion device 9633, power can be generated efficiently even under low illumination; therefore, an electronic book which does not require a commercial power source even indoors can be manufactured.

By using a semi-transmissive-type or reflective-type liquid crystal display device for the display portion 9631 of the electronic book shown in FIG. 11A, power consumption can be suppressed. Note that the photoelectric conversion device 9633 is not limited to a region shown in the figure, and can be appropriately provided in an empty space (a front surface or a rear surface) of the housing 9630. Note that as the battery 9635, there is an advantage in using a lithium ion battery in that size reduction or the like can be realized.

Figure 11B:
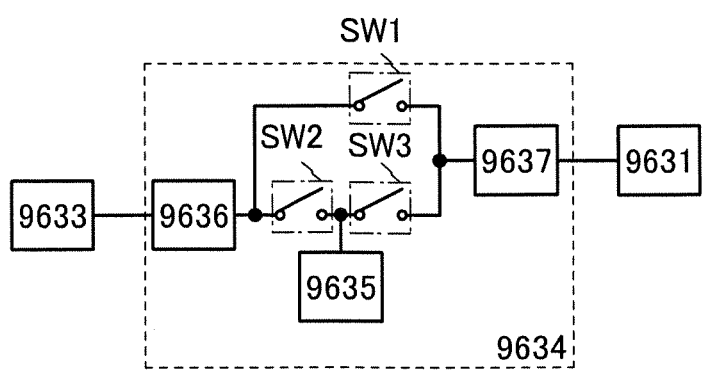

Furthermore, a structure and an operation of the charge and discharge control circuit 9634 shown in FIG. 11A will be described with reference to a block diagram in FIG. 11B. FIG. 11B shows the photoelectric conversion device 9633, the charge and discharge control circuit 9634, and the display portion 9631. Here, the charge and discharge control circuit 9634 includes the battery 9635, the DCDC converter 9636, the DCDC converter 9637, and switches SW1 to SW3.

First, an example of operation when power is generated by the photoelectric conversion device 9633 with external light will be described. A voltage of power that is generated by the photoelectric conversion device is raised or lowered in the DCDC converter 9636 so as to be a favorable voltage for charging the battery 9635. Then, when performing a display in the display portion 9631, the switch SW1 is turned on, the voltage of the power is raised or lowered in the DCDC converter 9637 to a voltage that is needed in the display portion 9631, and power is supplied to the display portion 9631. On the other hand, when a display is not performed in the display portion 9631, the SW1 is turned off and the SW2 is turned on to charge the battery 9635.

Next, an example of operation when power is not generated by the photoelectric conversion device 9633 due to poor external light will be described. By turning on the switch SW3, a voltage of power that is stored in the battery 9635 is raised or lowered by the DCDC converter 9637 to a voltage that is needed in the display portion 9631, and then supplied to the display portion 9631.

Note that in this embodiment, although two DCDC converters are provided between the photoelectric conversion device and the display portion, the DCDC converters therebetween may be omitted in a structure that allows directly supplying power to the display portion from the photoelectric conversion device, directly charging the battery from the photoelectric conversion device, or directly supplying power to the display portion from the battery.

Note that although an example of only using the photoelectric conversion device 9633 is described as one example of a power generation means, the battery 9635 may be charged by a combination of the photoelectric conversion device 9633 and a photoelectric conversion device with a different structure than the structure of the photoelectric conversion device 9633. Furthermore, the combination may be of the photoelectric conversion device 9633 and another power generation means.

This embodiment can be implemented in appropriate combination with the structures described in the other embodiments.

This application is based on Japanese Patent Application serial no. 2010-139666 filed with Japan Patent Office on Jun. 18, 2010, the entire contents of which are hereby incorporated by reference.

What is claimed is:

1. A manufacturing method of a photoelectric conversion device, comprising the steps of:
   forming a first conductive layer over a substrate;
   forming a first semiconductor layer having a first conductivity type over the first conductive layer;
   forming a second semiconductor layer comprising an intrinsic semiconductor over the first semiconductor layer;

forming a third semiconductor layer having a second conductivity type opposite to the first conductivity type over the second semiconductor layer;

forming a groove in the first conductive layer, the first semiconductor layer, the second semiconductor layer, and the third semiconductor layer to form a first electrode comprising a first part of the first conductive layer and a second electrode comprising a second part of the first conductive layer, and a first stack comprising a first part of the first to third semiconductor layers, and a second stack comprising a second part of the first to third semiconductor layers;

removing a part of the first stack and a part of the second stack using a first mask formed using a peelable resin so that a part of the first electrode and a part of the second electrode are exposed;

removing the first mask;

sealing the groove and a side surface portion of the etched second stack with an insulator;

covering a side surface portion of the etched first stack and a part of the first electrode with a second mask comprising the peelable resin;

forming a second conductive layer over the etched first stack, the etched second stack, the insulator, the first electrode, and the second mask;

removing the second mask so that the side surface portion of the etched first stack and a part of the first electrode are exposed and a third electrode and a fourth electrode are formed; and forming a fifth electrode connecting the first electrode and the fourth electrode.

2. The manufacturing method of a photoelectric conversion device, according to claim 1, wherein a part of the first mask is fixed in a structural defect formed in the each of the first stack and the second stack.

3. The manufacturing method of a photoelectric conversion device, according to claim 1, wherein the fifth electrode comprises a material selected from a silver paste, a nickel paste, a molybdenum paste, and a copper paste, or a stack thereof.

4. A manufacturing method of a photoelectric conversion device, comprising the steps of:
forming a first conductive layer over a substrate;
forming a first semiconductor layer having a first conductivity type over the first conductive layer:
forming a second semiconductor layer comprising an intrinsic semiconductor over the first semiconductor layer;
forming a third semiconductor layer having a second conductivity type opposite to the first conductivity type over the second semiconductor layer;
forming a second conductive layer over the third semiconductor layer;
performing selective etching on the second conductive layer using a mask formed using a peelable resin;
forming a groove in the first conductive layer, the first semiconductor layer, the second semiconductor layer, the third semiconductor layer, and the second conductive layer to form a first electrode comprising a first part of the first conductive layer, a second electrode comprising a second part of the first conductive layer, a first stack comprising a first part of the first to third semiconductor layers and a second stack comprising a second part of the first to third semiconductor layers, a third electrode comprising a first part of the second conductive layer, and a fourth electrode comprising a second part of the second conductive layer;

removing a part of the first stack and a part of the second stack using the mask so that a part of the first electrode and a part of the second electrode are exposed;

removing the mask;

sealing the groove and a side surface portion of the etched second stack with an insulator; and forming a fifth electrode connecting the first electrode and the fourth electrode.

5. A manufacturing method of a photoelectric conversion device, comprising the steps of:
forming a first conductive layer over a substrate;
forming a first semiconductor layer having a first conductivity type over the first conductive layer;
forming a second semiconductor layer comprising an intrinsic semiconductor over the first semiconductor layer;
forming a third semiconductor layer having a second conductivity type opposite to the first conductivity type over the second semiconductor layer;
selectively forming a second conductive layer using a shielding plate over the third semiconductor layer, so that a third electrode and a fourth electrode are formed;
forming a groove in the first conductive layer, the first semiconductor layer, the second semiconductor layer, and the third semiconductor layer to form a first electrode comprising a first part of the first conductive layer, a second electrode comprising a second part of the first conductive layer, a first stack comprising a first part of the first to third semiconductor layers, and a second stack comprising a second part of the first to third semiconductor layers;

removing a part of the first stack and a part of the second stack using the second electrode as a mask so that a part of the first electrode and a part of the second electrode are exposed;

sealing the groove and a side surface portion of the etched second stack with an insulator; and forming a fifth electrode connecting the first electrode and the fourth electrode.

6. The manufacturing method of a photoelectric conversion device, according to claim 4, wherein the fifth electrode comprises a carbon paste or an indium tin oxide paste.

7. The manufacturing method of a photoelectric conversion device, according to claim 5, wherein the fifth electrode comprises a carbon paste or an indium tin oxide paste.

8. The manufacturing method of a photoelectric conversion device, according to claim 1, wherein the groove is formed by laser processing.

9. The manufacturing method of a photoelectric conversion device, according to claim 4, wherein the groove is formed by laser processing.

10. The manufacturing method of a photoelectric conversion device, according to claim 5, wherein the groove is formed by laser processing.

* * * * *

UNITED STATES PATENT AND TRADEMARK OFFICE
CERTIFICATE OF CORRECTION

PATENT NO. : 9,059,347 B2
APPLICATION NO. : 13/159579
DATED : June 16, 2015
INVENTOR(S) : Nishi et al.

Page 1 of 1

It is certified that error appears in the above-identified patent and that said Letters Patent is hereby corrected as shown below:

In the Specification:

Col. 12, line 1, delete "0.5 μM" and insert --0.5 μm--

In the Claims:

Col. 17, line 44, claim 4, delete "layer:" and insert --layer;--

Signed and Sealed this
Sixteenth Day of August, 2016

Michelle K. Lee
*Director of the United States Patent and Trademark Office*